US012813362B2

(12) United States Patent
Palli et al.

(10) Patent No.: US 12,813,362 B2
(45) Date of Patent: Nov. 24, 2026

(54) SYSTEMS AND METHODS FOR REDUCING DIE SLIP DURING GROUP BONDING

(71) Applicant: Micron Technology, Inc., Boise, ID (US)

(72) Inventors: Siva Sai Kishore Palli, Hyderabad (IN); Venkata Rama Satya Pradeep Vempaty, Hyderabad (IN); Wen How Sim, Singapore (SG); Chen Yu Huang, Taichung (TW); Harjashan Veer Singh, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 982 days.

(21) Appl. No.: 17/939,880

(22) Filed: Sep. 7, 2022

(65) Prior Publication Data

US 2024/0079358 A1 Mar. 7, 2024

(51) Int. Cl.

| | |
|---|---|
| ***H10W 70/65*** | (2026.01) |
| ***H10W 70/05*** | (2026.01) |
| ***H10W 90/00*** | (2026.01) |
| *H10W 46/00* | (2026.01) |
| *H10W 72/00* | (2026.01) |

(Continued)

(52) U.S. Cl.

CPC ......... *H10W 90/701* (2026.01); *H10W 70/05* (2026.01); *H10W 70/65* (2026.01); *H10W 72/921* (2026.01); *H10W 90/00* (2026.01); *H10W 46/00* (2026.01); *H10W 72/01951* (2026.01); *H10W 72/07232* (2026.01); *H10W 72/07236* (2026.01); *H10W 72/07252* (2026.01); *H10W 72/07253* (2026.01); *H10W 72/221* (2026.01); *H10W 72/234* (2026.01); *H10W 72/90* (2026.01); *H10W 72/934* (2026.01); *H10W 90/722* (2026.01); *H10W 90/724* (2026.01)

(58) Field of Classification Search

CPC ............... H01L 24/05; H01L 23/49811; H01L 21/4846; H10W 90/701; H10W 70/65; H10W 70/05

See application file for complete search history.

(56) References Cited

U.S. PATENT DOCUMENTS

| | | | | |
|---|---|---|---|---|
| 10,410,999 | B2 * | 9/2019 | Baloglu | H10W 40/258 |
| 10,741,500 | B2 * | 8/2020 | Huang | H01L 25/16 |

(Continued)

*Primary Examiner* — Dale E Page
*Assistant Examiner* — Wilner Jean Baptiste
(74) *Attorney, Agent, or Firm* — Dorsey & Whitney LLP

(57) ABSTRACT

Stacked semiconductor devices, and related systems and methods, are disclosed herein. In some embodiments, the stacked semiconductor device includes a package substrate and a die stack carried by the package substrate. The die stack can include at least a first semiconductor die carried by the package substrate, a second semiconductor die carried by the first semiconductor die. The first semiconductor die can have an upper surface and a first bond pad carried by the upper surface that includes a curvilinear concave depression formed in an uppermost surface of the first bond pad. The second semiconductor die has a lower surface and a second bond pad carried by the lower surface. The die stack can also include solder structure electrically coupling the first and second bond pads and at least partially filling the curvilinear concave depression formed in the uppermost surface of the first bond pad.

14 Claims, 10 Drawing Sheets

(51) Int. Cl.
*H10W 72/20* (2026.01)
*H10W 72/90* (2026.01)

(56) References Cited

U.S. PATENT DOCUMENTS

| | | | | |
|---|---|---|---|---|
| 11,869,879 | B2 * | 1/2024 | Kim | H10W 74/117 |
| 2010/0219524 | A1 * | 9/2010 | Shen | H10W 40/251<br>257/E23.06 |
| 2022/0068886 | A1 * | 3/2022 | Chung | H10W 90/00 |

* cited by examiner

SYSTEMS AND METHODS FOR REDUCING DIE SLIP DURING GROUP BONDING

TECHNICAL FIELD

The present technology is generally related to systems and methods for reducing die slippage in stacked semiconductor devices. In particular, the present technology relates to craters formed in bond pads to reduce die slippage.

BACKGROUND

Microelectronic devices, such as memory devices, microprocessors, and other electronics, typically include one or more semiconductor dies mounted on a substrate and encased in a protective covering. The semiconductor dies include functional features, such as memory cells, processor circuits, interconnecting circuitry, etc. To meet continual demands on decreasing size, individual semiconductor dies and/or active components are typically manufactured in bulk and then stacked on a printed circuit board (PCB) or other substrates. The die stacks can make use of bond pads and/or metallization layers on each side of the semiconductor dies in the die stacks to form electrical connections. The die stacks are then heated to reflow solder structures between the bond pads. However, the electrical connections formed by the solder structures are dependent on alignment between the dies and the bond pads thereon.

Figure 1:
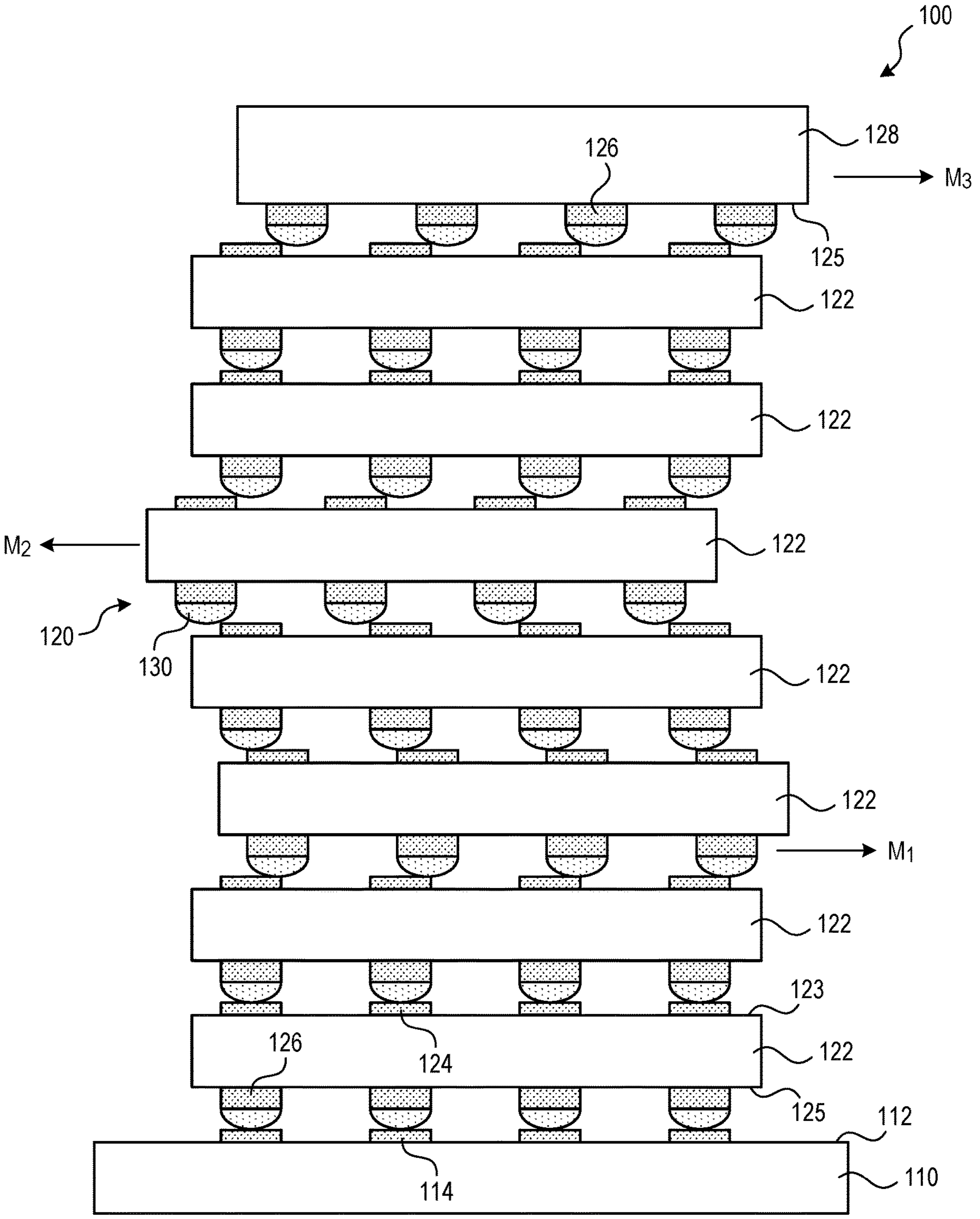
FIG. 1 is a partially schematic cross-sectional view of a stacked semiconductor device 100 with die slipping issues in accordance with some embodiments of the present technology.

The drawings have not necessarily been drawn to scale. Further, it will be understood that several of the drawings have been drawn partially schematically. Similarly, some components and/or operations can be separated into different blocks or combined into a single block for the purpose of discussing some of the implementations of the present technology. Moreover, while the technology is amenable to various modifications and alternative forms, specific implementations have been shown by way of example in the drawings and are described in detail below. The intention, however, is not to limit the technology to the particular implementations described.

DETAILED DESCRIPTION

Stacked semiconductor devices are typically formed by stacking each die in the die stack on a package substrate (or other suitable substrate) with corresponding pairs of bond pads having a solder structure positioned between them. For example, the solder structure can be a solder ball formed on one of the bond pads in the pair. The manufacturing process can then apply heat and/or a load to the die stack in a bonding process to reflow each of the solder structures to electrically, thermally, and/or physically couple the corresponding pairs of bond pads. To be successful, the die stack must be carefully aligned before the bonding process to ensure alignment between pairs of bond pads (sometimes also referred to herein as contact pads) when heat and compression are applied to the die stack. If the bond pads are not aligned, no joint will be formed when the solder structures are reflowed. The missing joint can undermine the structural and/or electrical integrity of the stacked semiconductor device. For example, if the third die in a ten-die stack is misaligned, each of the third-tenth dies may not be electrically coupled to the package substrate. As a result, the stacked semiconductor device will not have a usable performance rating. Problems with misalignment are exacerbated by die slippage. Die slippage occurs when forces in the die stack cause one or more of the dies to move laterally, undermining any previously established alignment. The forces can result from the expansion of the solder structures during the bonding process, compression applied to the die stack during the bonding process, and/or the weight of the dies in the die stack. Each source can cause the solder to move laterally, thereby causing the die slippage.

Stacked semiconductor devices, and related systems and methods, are disclosed herein to help address the problems discussed above. In some embodiments, the stacked semiconductor device includes a package substrate and a stack of semiconductor dies carried by the package substrate. The stack of semiconductor dies ("die stack") can include at least a first semiconductor die carried by the package substrate, a second semiconductor die carried by the first semiconductor die, and a solder structure (e.g., a reflowed solder ball) electrically coupled between the first and second semiconductor dies. For example, the first semiconductor die can have an upper surface and a first bond pad carried by the upper surface while the second semiconductor die has a lower surface and a second bond pad carried by the lower surface. The solder structure can be electrically coupled between the first and second bond pads. To reduce the chance of die slippage (and thereby maintain alignment of the dies in the die stack), the first bond pad can include a depression formed in the uppermost surface of the first bond pad that interfaces with the solder structure such that the solder structure at least partially fills the depression. In some embodiments, the depression has a curvilinear, concave shape that generally matches the shape of the solder structure before a bonding process (e.g., matching the shape of a solder ball). In some embodiments, the depression has a stepped concave shape and/or a series of linear sloped walls that interface with solder structure. Further, in some embodiments, the depression is formed in the lowermost surface of the second bond pads instead of (or in addition to) the uppermost surface of the first bond pads.

The depression can reduce the chance of die slippage by increasing the contact area between the first bond pad and the solder structure relative to a planar contact area of a bond pad with an identical plan-form dimension and no depression formed thereon. In some embodiments, the depression increases the contact pressure (e.g., the pressure between two surfaces) between the first bond pad and the solder structure during a bonding process. The contact pressure helps resist movement between two surfaces due to the forces therebetween. Accordingly, by increasing the contact pressure, the depression reduces the chance that pressure from dies in the die stack (e.g., resulting from their load on the dies beneath them) and/or the expansion of the solder structure (and other conductive features in the die stack) will exceed the maximum contact pressure. Additionally, the depression can provide the solder structure with room to expand into that maintains contact with the bond pad, thereby reducing the chance that the expansion will cause die slippage.

In some embodiments, depression has a depth that is between 3 percent and 15 percent of the height of the solder structure before a bonding process. In some embodiments, the depression has a depth between 0.2 micrometers (μm) and 1.2 μm. In some embodiments, the depression has a depth below 0.2 μm. In some embodiments, the depression has a width (or diameter) that is between 5 percent and 25 percent of the diameter of the solder structure before the bonding process.

In some embodiments, the die stack includes additional semiconductor dies carried by the first and second semiconductor dies. In such embodiments, each of the semiconductor dies in the die stack be electrically and/or physically coupled through an interface that includes a lower bond pad (e.g., analogous to the first bond pad above) on a lower die, an upper bond pad (e.g., analogous to the second bond pad above) on an upper die, and a solder structure electrically and/or physically coupling the lower and upper bond pads. Further, each of the interfaces can include a depression formed in at least one of the lower and upper bond pads that is at least partially filled by the solder structure.

In some embodiments, the first semiconductor die is also electrically and/or physically coupled to the package substrate through an interface that includes two bond pads (e.g., one on the package substrate and one on the first semiconductor die) and a solder structure electrically and/or physically coupling the two bond pads. In such embodiments, at least one of the two bond pads (e.g., the bond pad on the package substrate) can include a depression formed thereon that interfaces with the solder structure to reduce the chance of die slippage between the package substrate and the first semiconductor die.

An example of a method for forming a stacked semiconductor device, in accordance with some embodiments of the present technology, includes, for each of N-number of semiconductor dies (e.g., one or more), forming a first bond pad with a depression on a first side of the semiconductor die; forming a second bond pad with on a second side of the semiconductor die opposite the first side; and forming a solder structure on the second bond pad. Once each of the N-number of semiconductor dies has been formed with the first and second bond pads, the method includes stacking the N-number of semiconductor dies along with a top semiconductor die (e.g., only having the second bond pads and a solder structure formed on each of the second bond pads) on a package substrate. In the stack, the first and second bond pads of corresponding pairs of semiconductor dies are aligned, with the solder structure at least partially filling the depression of the first bond pad in each of the corresponding pairs. The method can then include heating the stacked semiconductor dies in a bonding process to reflow (or at least partially reflow) the solder structures, thereby electrically and/or physically coupling the first and second bond pads of the corresponding pairs of semiconductor dies.

In some embodiments, forming the first bond pad with the depression includes depositing a photoresist mask on the first side of the semiconductor die, patterning the photoresist mask to create an opening with a central, non-patterned portion of the photoresist mask, and at least partially filling the opening with a conductive material. In some embodiments, the formation process also includes a repetitive process (e.g., with M-number of iterations) of re-patterning the photoresist mask to reduce the size of the central, non-patterned portion of the photoresist mask in the opening and at least partially filling the opening with a conductive material. In various embodiments, the repetitions can form a curvilinear depression, a stepped depression, a depression with various sloped sidewalls, and the like. In some embodiments, the reduction in the size of the central, non-patterned portion of the photoresist mask is controlled in each iteration to help shape the depression to match the solder structure (e.g., to match the outer surface of a solder ball). In some embodiments, the Mth iteration removes all of the non-patterned portion of the photoresist mask from the opening.

In some embodiments, forming the first bond pad with the depression includes depositing a conductive material on the first side of the semiconductor die to form the first bond pad, forming a photoresist mask over the first side of the semiconductor die and the first bond pad, patterning the photoresist mask to create an opening that exposes a portion of the first bond pad, and etching the conductive material in the first bond pad through the opening to form at least a portion of the depression. In various embodiments, the etching process can be perfectly isotropic (e.g., resulting in a curvilinear depression), perfectly anisotropic (e.g., resulting in vertical sidewalls), an imperfectly anisotropic wet etching process (e.g., resulting in sloped sidewalls), and the like. In some embodiments, the formation process includes any suitable number of additional iterations (e.g., one iteration, three iterations, five iterations, ten iterations, and/or any other suitable number) of patterning the photoresist material and etching the conductive material in the first bond pad through the patterned photoresist material.

FIG. 1 is a partially schematic cross-sectional view of a stacked semiconductor device 100 with die slipping issues in accordance with some embodiments of the present technology. As illustrated in FIG. 1, the stacked semiconductor device 100 ("device 100") includes a package substrate 110 with an active surface 112 and one or more base bond pads 114 (four shown) formed on the active surface 112. The device 100 also includes a stack of semiconductor dies 120 carried by package substrate 110 and electrically coupled to the base bond pads 114. The stack of semiconductor dies 120 (also referred to herein as a "die stack 120") includes one or more core dies 122 (seven shown), each of which has an upper surface 123 and a lower surface 125 opposite the upper surface 123. Each of the core dies 122 also includes one or more first bond pads 124 (four shown) formed on the upper surface 123 and one or more second bond pads 126 (four shown) formed on the lower surface 125. The die stack 120 also includes a top die 128 and one or more of the second bond pads 126 (four shown) formed on the lower surface 125 of the top die 128.

As further illustrated in FIG. 1, the device 100 also includes a solder structure 130 (e.g., a solder ball or other suitable structure) for each corresponding pair of the first and second bond pads 124, 126 (e.g., the first bond pads 124 on the lowermost core die 122*a* in the die stack 120 and the second bond pads 126 on the second core die 122*b* in the die stack 120, and so on). The solder structures 130 can help form electrical and/or physical bonds between the dies in the die stack 120, thereby holding the die stack 120 together and enabling the operation of the dies in the die stack 120.

During a manufacturing process, to enable the solder structures 130 to form the electrical and/or physical connections, the solder structures 130 can be formed on the second bond pads 126 of each of the dies (or on the first bond pads 124 of each of the dies). The core dies 122 and the top die 128 can then be stacked with the corresponding pairs of bond pads vertically aligned and the solder structures 130 positioned therebetween. The die stack 120 can then be heated and/or pressured in a bonding process to reflow the solder structures 130 and form a connection between the corresponding pairs of bond pads.

However, as further illustrated in FIG. 1, die slippage in the die stack 120 can misalign one or more of the corresponding pairs. In the embodiment illustrated in FIG. 1, for example, the third core die 122*c* has slid along a first movement path $M_1$, the fifth core die 122*e* has slid along a second movement path $M_2$, and the top die 128 has slid along a third movement path $M_3$. The movements of any of the third die122*c*, the fifth die122*e*, and the top die 128 can misalign corresponding pairs of the first and second bond pads 124, 126. In turn, the misalignment can undermine the electrical and/or physical integrity of the die stack 120. Purely by way of example, the misalignment of the fifth core die 122*e* can result in no electrical connection being formed between the first bond pads 124 on the fifth core die 122*e* and the second bond pads 126 on the sixth core die 122*f*. As a result, the sixth core die 122*f* (and every die above the sixth core die 1220 are not functional with the remainder of the die stack 120. Therefore, the die slippage illustrated in FIG. 1 can severely undermine the electrical and/or physical integrity of the die stack 120, and therefore the overall value of the semiconductor device 100.

Figure 2:
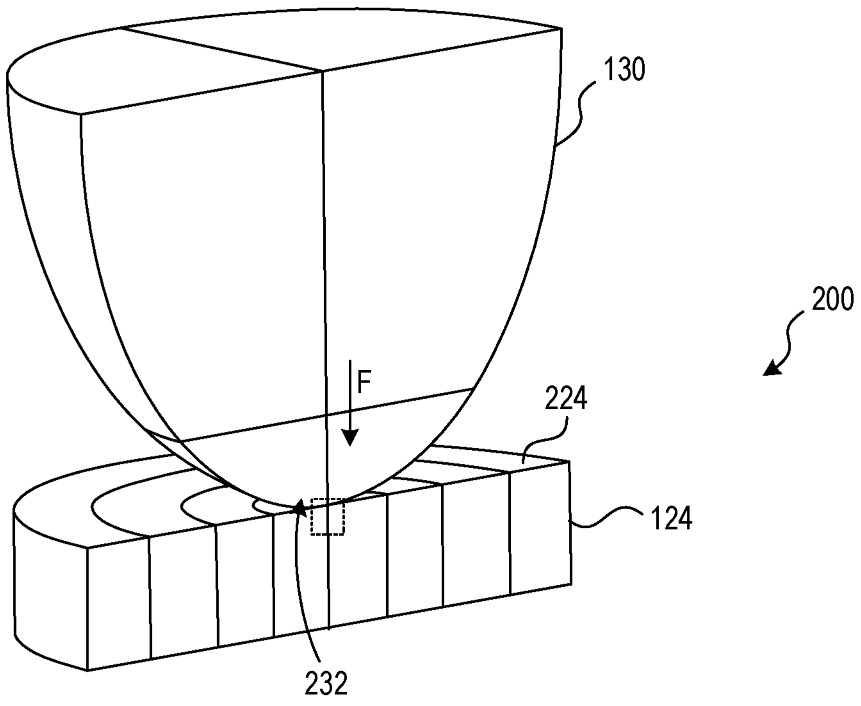
FIG. 2 is a partially schematic cross-sectional view of an interface in accordance with some embodiments of the present technology.

FIG. 2 is a partially schematic cross-sectional view of an interface 200 in accordance with some embodiments of the present technology. The interface 200, in the illustrated embodiment, is representative of the interface between a solder structure 130 (e.g., a solder ball, prior to reflow) and a first bond pad 124 in the die stack 120 of FIG. 1. As illustrated in FIG. 2, the interface 200 is defined by a distal tip 232 of the solder structure 130 contacting an upper surface 224 of the first bond pad 124 in a region R. A force pushes downwards along force line F during the stacking and bonding process. The force can result from the expansion of the solder structure 130 as it is heated during the bonding process, the weight of dies as they are stacked over the interface 200 (e.g., constructing the die stack 120 of FIG. 1), and/or load that is applied to the die stack during a bonding process.

The inventors have realized that the interface 200 has a contact pressure resulting from the pressure between surfaces at the interface 200 (e.g., the pressure between the solder structure 130 and the upper surface 224). While the force the force along the force line F during the bonding process can result in deleterious effects (e.g., the solder structure 130 sliding longitudinally with respect to the first bond pad 124), the contact pressure can help resist the deleterious effects. In particular, the contact pressure helps the surfaces at the interface 200 grip each other. As a result, the higher the contact pressure (i.e., the higher the mutual pressure between the surfaces), the less chance there is of die slippage occurring. In a typical stacked semiconductor device, the maximum contact pressure (e.g., the highest value in contact pressure at the interface 200) is between about 420 megapascals (MPa) and about 460 MPa, or at about 444 MPa. Between increasing pressures from stacks of semiconductor dies, expansion of the solder structure 130 during a bonding process, and load applied to the die stack during the bonding process, the magnitude of the force along force line F typical at the interface 200 (or similar interfaces) is constantly increasing, thereby increasing the chance of die slippage and threatening to undermine the electrical and/or structural integrity of the resulting die stacks.

Figure 3A:
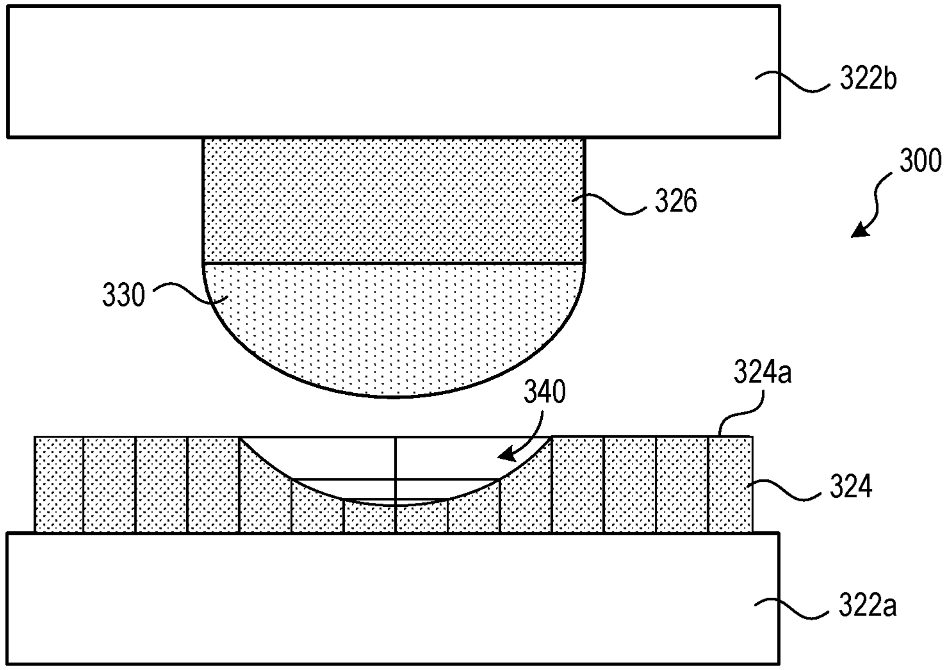
FIGS. 3A and 3B are partially schematic cross-sectional views of an interface configured in accordance with some embodiments of the present technology.
Figure 3B:
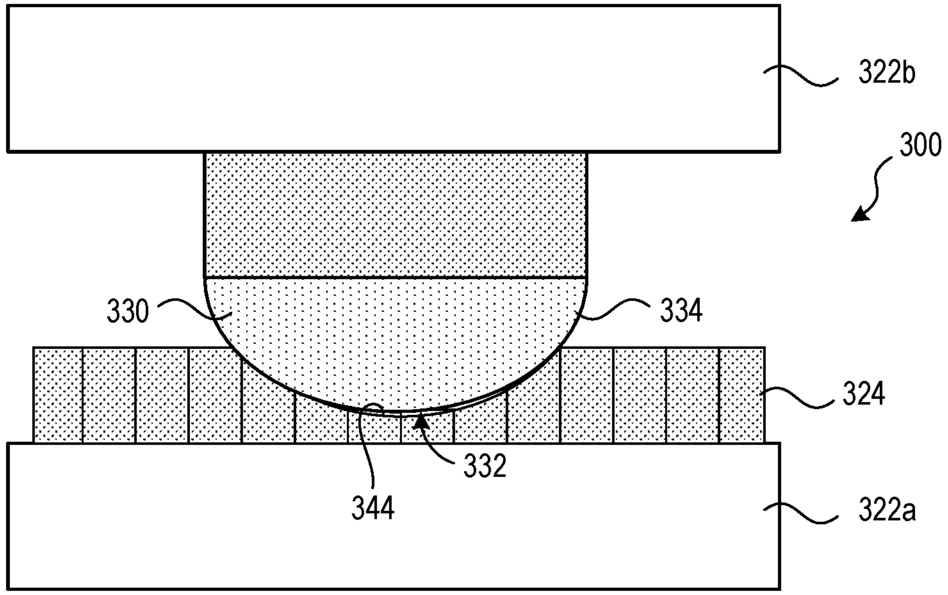

FIGS. 3A and 3B are partially schematic cross-sectional views of an interface 300 configured in accordance with some embodiments of the present technology. The interface 300 illustrated in FIGS. 3A and 3B joins a first bond pad 324 on a first core die 322*a* to a second bond pad 326 on a second core die 322*b* through a solder structure 330 (e.g., a solder ball, or other suitable solder structure) connection. As best illustrated in FIG. 3A, the first bond pad 324 includes a curvilinear, concave depression 340 (sometimes also referred to herein as a "solder matching feature," and/or a "crater") formed in an upper surface 324*a* of the first bond pad 324. The depression 340 can increase the maximum contact pressure for the interface 300 by increasing the surface are of contact between the first bond pad 324 and the solder structure 330.

For example, as best illustrated in FIG. 3B, the depression 340 can have an interface surface 344 that is curved to generally match at least a portion of a bonding surface 334 of a distal tip 332 of the solder structure 330. The match between the bonding surface 334 and the interface surface 344 increases the area of contact between the solder structure 330 and the first bond pad 324, thereby increasing the maximum contact pressure for the interface 300. As a result, the inclusion of the depression 340 into the first bond pad 324 can reduce the chance that the second core die 322*b* will slip during a stacking process and/or during a bonding process on the stacked dies.

In some embodiments, the arrangement of features on the first bond pad 324, solder structure 330, and the second bond pad 326 is inversed. That is, the solder structure 330 can be formed on the first bond pad 324 and the depression 340 can be formed into the second bond pad 326 to increase the maximum contact pressure of the interface. Further, although discussed primarily herein with reference to the interface between two dies in the die stack, the interface between the package substrate and a lowermost die in the die stack can also include bond pads with a depression formed thereon.

Figure 4A:
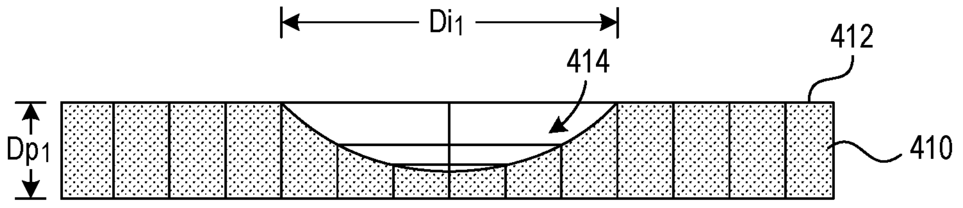
FIGS. 4A and 4B are partially schematic cross-sectional views of bond pads illustrating addition features of a depression formed thereon in accordance with some embodiments of the present technology.

FIG. 4A is a partially schematic cross-sectional view of a bond pad 410 illustrating additional features of a depression 414 formed thereon in accordance with some embodiments of the present technology. As illustrated in FIG. 4A, the depression 414 is formed into an upper surface 412 of the bond pad 410 and has a curvilinear, concave shape. In some embodiments, the curvilinear shape is generally spherical. In other embodiments, the curvilinear shape is generally ellipsoidal (e.g., conforming to an oblate spheroid and/or a prolate spheroid). In still other embodiments, the depression 414 can have a stepped concave shape, a series of sloped walls generally defining a concave shape, and/or any other suitable shape.

In the embodiment illustrated in FIG. 4A, the depression 414 has a first depth $Dp_1$ and a first diameter $Di_1$. In some embodiments, the first depth $Dp_1$ is selected based on a desired depth, then the first diameter $Di_1$ (and the curvilinear shape) is calculated to match the interface surface 416 of the bond pad 410 to known dimensions of a solder structure (e.g., an average size of a solder ball in a die stack). In some embodiments, the first diameter $Di_1$ is selected based on a desired diameter, then the first depth $Dp_1$ (and the curvilinear shape) is calculated to match the interface surface 416 of the bond pad 410 to known dimensions of a solder structure. In some embodiments, the first depth $Dp_1$ and the first diameter $Di_1$ are sized to maximize the size of the interface surface 416 based on the size of the bond pad 410 and/or the solder structure. For example, when the bond pad 410 has a thickness of about 4 the first depth $Dp_1$ can be between about 1 μm and about 2.5 μm (e.g., between about 25 percent of the bond pad 410 and about 75 percent) while the first diameter $Di_1$ can be between about 2 μm and about 5 In such embodiments, the first depth $Dp_1$ can be between about 7.2 percent the size of the solder structure and between about 18 percent the size of the solder structure, while the first diameter $Di_1$ can be between about 5 percent the size of the solder structure and about 25 percent the size of the solder structure.

As discussed above, the inclusion of the depression 414 into the bond pad 410 increases the area of contact between the solder structure and the bond pad 410, which can thereby increase the maximum contact pressure for the corresponding interface. Purely by way of a specific, non-limiting example, the inventors measure that for a bond pad 410 with a thickness of about 5 μm and a depression 414 with a first depth $Dp_1$ of about 2.5 the depression 414 increased the maximum contact pressure from about 444 MPa to about 616 MPa, on average. The resulting increase in the maximum contact pressure can reduce the chance of issue with die slippage during a stacking process and/or during a bonding process on the stacked dies.

Figure 4B:
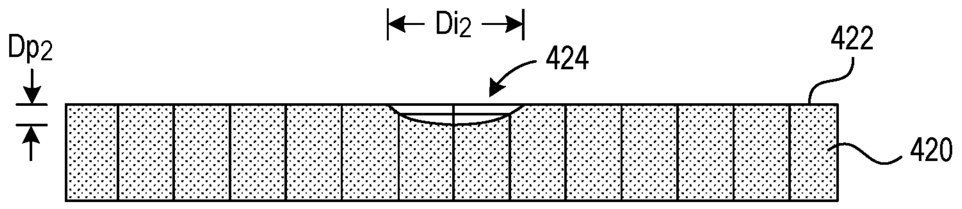

In some embodiments, rather than maximizing the size of the interface surface based on the size of the bond pad and/or the solder structure, the size of the depression can be chosen to increase the contact area (e.g., relative to a bond pad with a planar contact area) between the bond pad and the solder structure as the solder structure expands (e.g., as it is heated in the bonding process). For example, FIG. 4B is a partially schematic cross-sectional view of a depression 424 formed in an upper surface 412 of a bond pad 420 in accordance with further embodiments of the present technology. In the illustrated embodiment, the depression 424 has a second depth $Dp_2$ and a second diameter $Di_2$ that are smaller than the depth $Dp_1$ and the first diameter $Di_1$, respectively, of the depression 414 illustrated in FIG. 4A. For example, when the bond pad 420 has a thickness of about 4 the second depth $Dp_2$ can be between about 0.1 μm and about 1 μm (e.g., between about 2.5 percent of the bond pad 420 and about 25 percent) while the second diameter $Di_2$ can be between about 2 μm and about 5 In such embodiments, the second depth $Dp_2$ can be between about 0.7 percent the size of the solder structure and about 7.2 percent the size of the solder structure, while the second diameter $Di_2$ can be between about 5 percent the size of the solder structure and about 25 percent the size of the solder structure.

The smaller dimensions of the depression 424 can allow the depression 424 to conform to a distal tip of the solder structure during the stacking process, and to accept a distalmost portion of the solder structure without impeding the expansion of the solder structure during the bonding process. As a result, the depression 424 can significantly increase the contact area between the solder structure and the bond pad. Purely by way of a specific, non-limiting example, the inventors measure that for a bond pad 420 with a thickness of about 4 μm and a depression 424 with a first depth $Dp_2$ of about 0.2 the depression 424 increased the maximum contact pressure from about 444 MPa to about 1416.5 MPa, on average. The resulting increase in the maximum contact pressure can reduce the chance of issues with die slippage during a stacking process and/or during a bonding process on the stacked dies.

Figure 5:
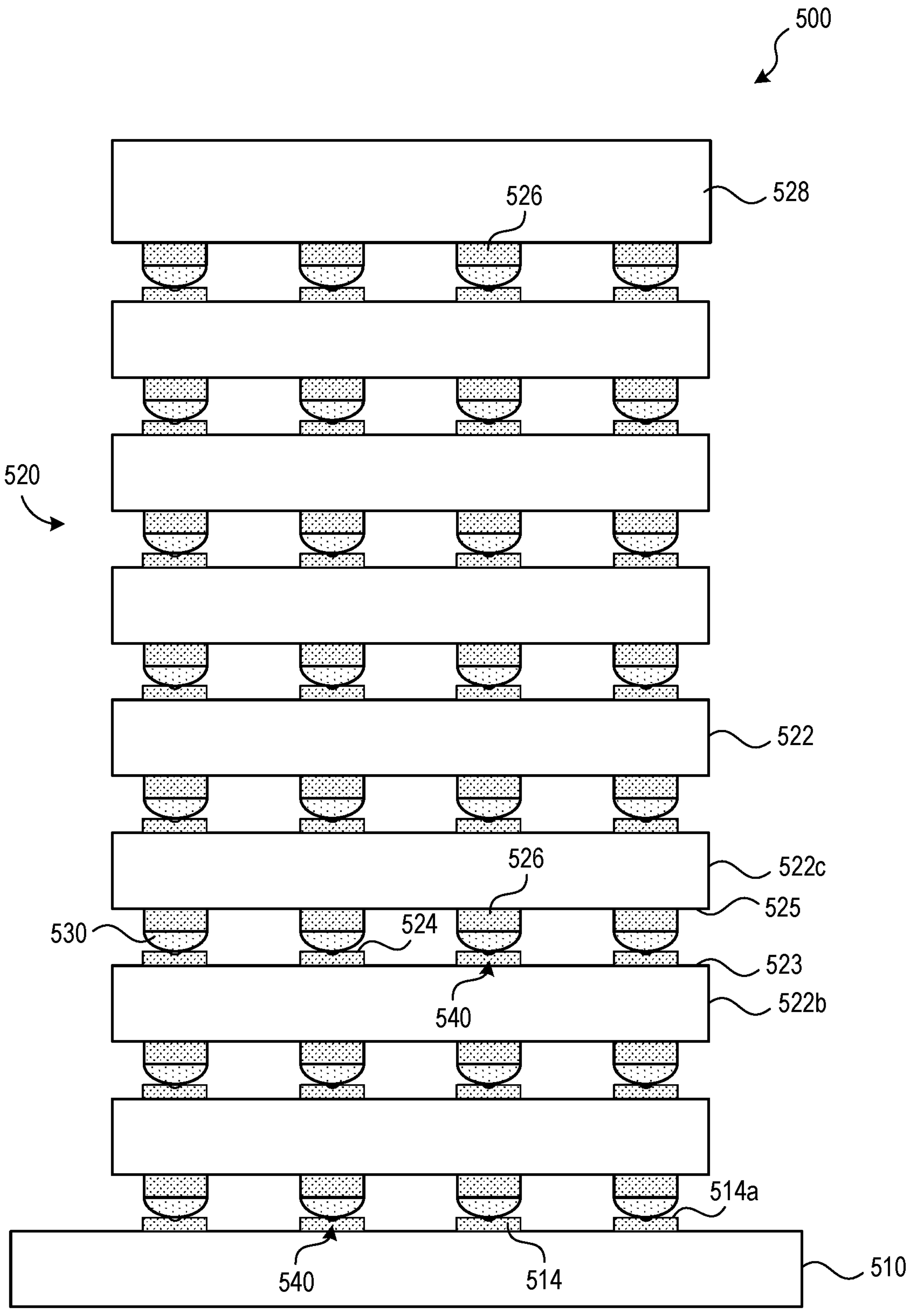
FIG. 5 is a partially schematic cross-sectional view of a stacked semiconductor device configured in accordance with some embodiments of the present technology.

FIG. 5 is a partially schematic cross-sectional view of a stacked semiconductor device 500 configured in accordance with some embodiments of the present technology. In the illustrated embodiment, the stacked semiconductor device 500 ("device 500") includes a package substrate 510 with an active surface 512 (sometimes also referred to herein as an "upper surface" and/or a "stacking surface") and one or more base bond pads 514 (four shown) formed on the active surface 512. The device 500 also includes a stack of semiconductor dies 520 carried by the package substrate 510 and electrically coupled to the base bond pads 514. The stack of semiconductor dies 520 (also referred to herein as a "die stack 520") includes one or more core dies 522 (seven shown), each of which has an upper surface 523, a lower surface 525, one or more first bond pads 524 (four shown) formed on the upper surface 523, and one or more second bond pads 526 (four shown) formed on the lower surface 525. The die stack 520 also includes a top die 528 (sometimes also referred to herein as an "uppermost die") and one or more of the second bond pads 526 (four shown) formed on the lower surface 525 of the top die 528.

As further illustrated in FIG. 5, the device 500 also includes a solder structure 530 (e.g., a solder ball or other suitable structure) for each corresponding pair of the first and second bond pads 524, 526 (e.g., the first bond pads 524 on the second core die 522*b* and the second bond pads 526 on the third core die 522*c*). The solder structures 530 can help form electrical and/or physical bonds between the dies in the die stack 520, thereby holding the die stack 520 together and enabling the operation of the dies in the die stack 520. Further, each of the first bond pads 524, as well as each of the base bond pads 514, includes a depression 540 formed thereon. Each depression 540 interfaces with a corresponding one of the solder structures 530, increasing the surface area of the contact between the first bond pads 524 (or the base bond pads 514) and the solder structures 530. As a result, each depression can increase the maximum contact pressure between corresponding pairs of the first and second bond pads 524, 526 (and/or corresponding pairs of the base and second bond pads 514, 526) and reduce the chance that any of the core dies 522 and/or the top die 528 will slide during the stacking process and/or the bonding process.

In the illustrated embodiment, each of the first bond pads 524 on each of the core dies 522 includes a depression 540 formed thereon. In some embodiments, only a subset of the first bond pads 524 includes a depression 540. For example, half of the first bond pads 524 on each of the core dies 522 can include a depression 540. In various other examples, any suitable portion of the first bond pads 524 on each of the core dies 522 can include a depression 540 (e.g., a quarter, three-quarters, a third, two-thirds, etc.). In some embodiments, only a subset of the core dies 522 include first bond pads 524 with a depression 540 formed thereon. For example, the depression 540 can be limited to regions of the die stack 520 that are especially likely to slide (e.g., at the interface between an uppermost one of the core dies 522 and the top die 528). Further, in some embodiments, the solder structures 530 can be formed on the first bond pads 524 while the depression is formed into one or more of the second bond pads 526 (e.g., reversing the illustrated arrangement).

FIGS. 6A-6H are partially schematic cross-sectional views illustrating the formation of a bond pad with a depression in accordance with some embodiments of the present technology. More specifically, FIGS. 6A-6H illustrate the formation of the depression simultaneously with the formation of the bond pad through a series of deposition processes.

Figure 6A:
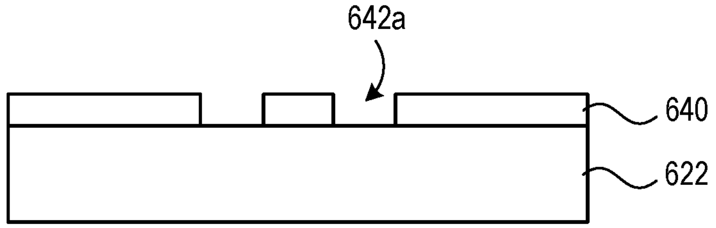
FIGS. 6A-6H are partially schematic cross-sectional views illustrating the formation of a bond pad with a depression in accordance with some embodiments of the present technology.

As illustrated in FIG. 6A, the formation process begins by depositing a photoresist material 640 on a semiconductor substrate 622 (e.g., one of the core dies 522 and/or the package substrate 510 of FIG. 5). The photoresist material 640 is then patterned to form one or more openings 642*a* corresponding to each of the bond pads to be formed on the semiconductor substrate 622. The openings 642*a* can have a donut shape (shown in cross-section), with a ring that surrounds a non-patterned portion of the photoresist material 640 in the center of the openings 642*a*.

Figure 6B:
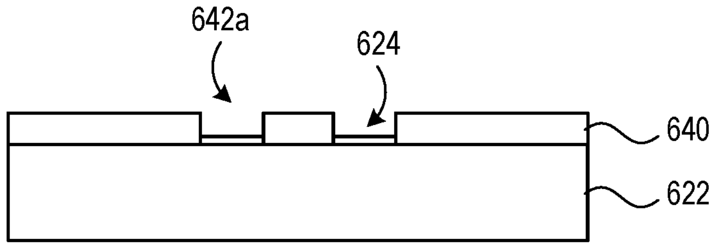
Figure 6C:
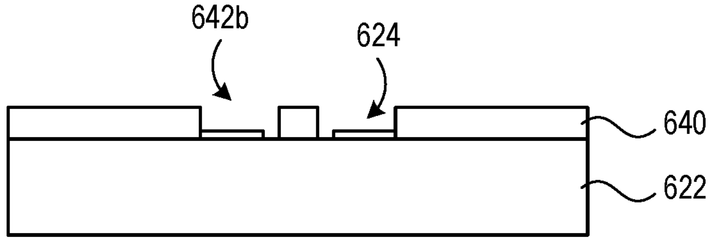

As illustrated in FIG. 6B, each of the openings 642*a* can then be partially (or fully) filled with a conductive material 624 through any suitable deposition process. In the illustrated embodiment, the conductive material 624 only partially fills the openings 642*a*, allowing the photoresist material 640 to be used in further steps of the formation process. For example, as illustrated in FIG. 6C, the formation process can continue by repatterning the photoresist material to form new openings 642*b* with a smaller amount of the photoresist material 640 in the center of the openings 642*b*. That is, the openings 642*b* expose the previously deposited layer of the conductive material 624 as well as a portion of the semiconductor substrate 622 in the center of the ring of the conductive material 624.

Figure 6D:
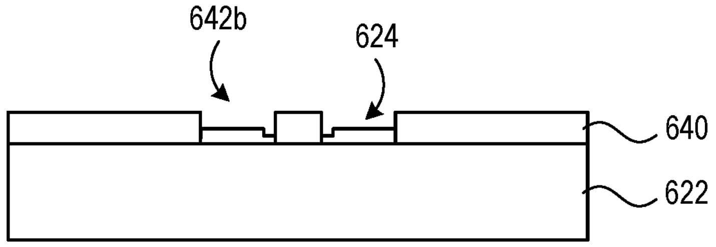
Figure 6E:
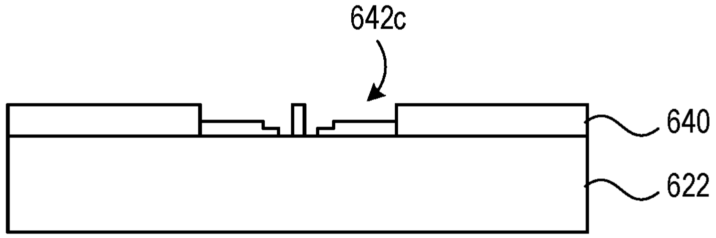

As illustrated in FIG. 6D, an additional layer of the conductive material 624 can then be deposited into the openings 642*b*. In the illustrated embodiment, the new deposition can result in a stepped ring of the conductive material (e.g., a first step corresponding to the first deposition and a second step corresponding to the second deposition. In various other embodiments, the new deposition can result in a linear, sloped transition between the first and second depositions and/or a curvilinear transition between the first and second depositions.

Figure 6F:
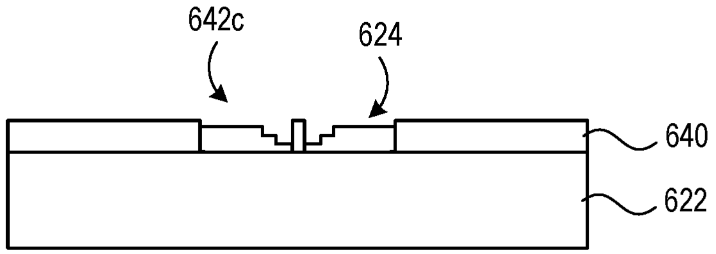
Figure 6G:
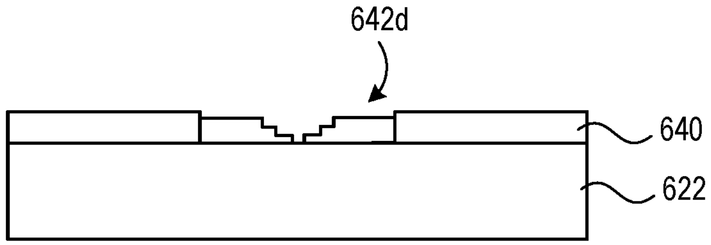
Figure 6H:
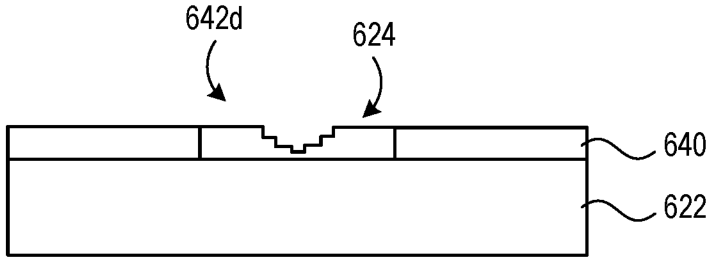

The re-patterning and deposition processes can then be repeated until the bond pad is fully formed. For example, the photoresist material 640 can be repatterned to form new openings 642*c*, as illustrated in FIG. 6C; an additional layer of the conductive material 624 can then be deposited into the openings 642*c*, as illustrated in FIG. 6F; the photoresist material 640 can be repatterned to form new openings 642*d*, as illustrated in FIG. 6G (e.g., fully removing the photoresist material 640 from the center of the openings 642*d*); and final layer of the conductive material 624 can then be deposited into the openings 642*d* to complete the bond pads, as illustrated in FIG. 6H.

In some embodiments, the repatterning processes can reduce the size of the photoresist material 640 at the center of the openings 642 by a non-constant amount to help create a depression in the bond pad that matches (or generally matches) the shape of the solder structure (e.g., the solder ball) that the bond pad will interface within a die stack. In some embodiments, the formation process can include a grinding or other removal process to help create a curvilinear shape and/or to help match the shape of the depression to the shape of the solder structure.

In some embodiments, the openings 642 in the photoresist material 640 are fully filled and the photoresist material 640 is replaced by a second photoresist material for each repetition of the process. For example, when the deposition process covers the photoresist material 640, the photoresist material 640 may need to be stripped entirely. In such embodiments, the formation process includes stripping the old photoresist material, depositing a new photoresist material, and patterning the new photoresist material in place of each of the repatterning processes discussed above.

FIGS. 7A-7F are partially schematic cross-sectional views illustrating the formation of a bond pad with a depression in accordance with some embodiments of the present technology. More specifically, FIGS. 7A-7F illustrate the formation of the depression into a fully formed bond pad through a series of etching processes.

Figure 7A:
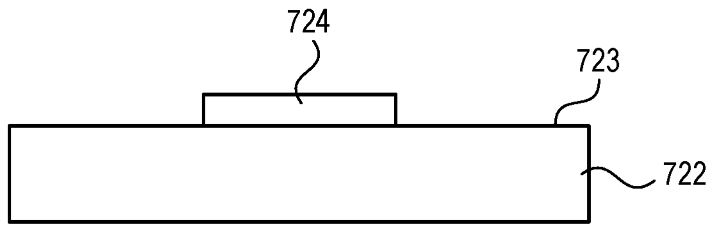
FIGS. 7A-7F are partially schematic cross-sectional views illustrating the formation of a bond pad with a depression in accordance with some embodiments of the present technology.

As illustrated in FIG. 7A, the formation process begins by forming one or more bond pads 724 (one shown) on a surface 723 of a semiconductor substrate 722 (e.g., one of the core dies 522 and/or the package substrate 510 of FIG. 5). The bond pad 724 can be formed by any suitable process, such as by depositing a conductive material into a patterned photoresist layer.

Figure 7B:
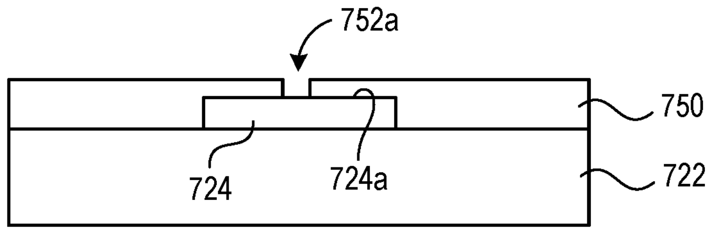
Figure 7C:
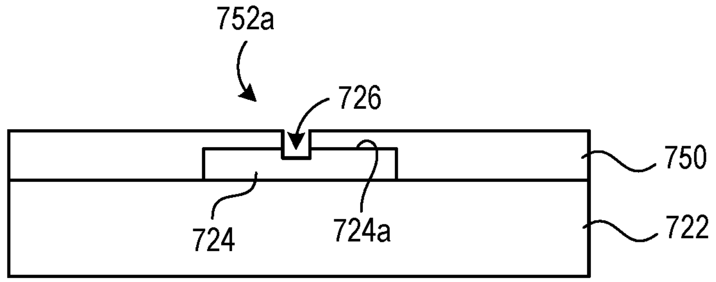
Figure 7D:
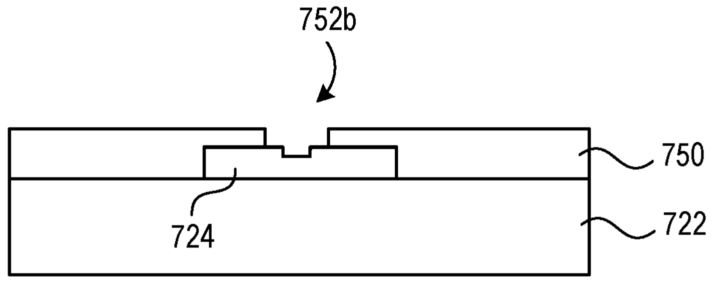
Figure 7E:
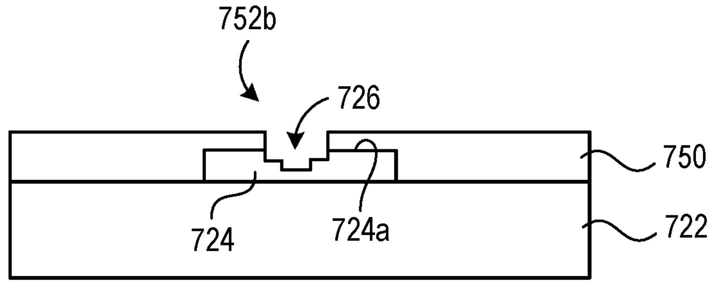
Figure 7F:
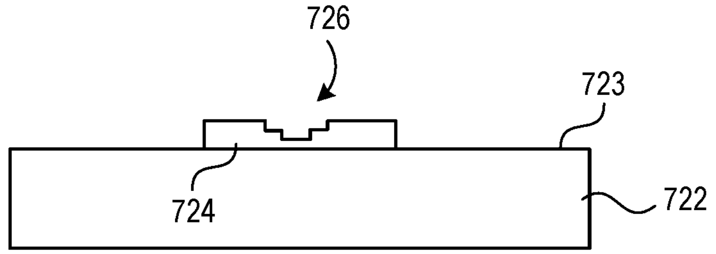

As illustrated in FIG. 7B, the formation process can continue by depositing a photoresist material 750 over the bond pad 724 and the semiconductor substrate 722 and patterning the photoresist material 750 to form an opening 752*a* that exposes the outer surface 724*a* of the bond pad 724. As illustrated in FIG. 7C, the formation process can then include etching the outer surface 724*a* of the bond pad 724 through the opening 752*a* to form a depression 726 in the outer surface 724*a*. Similar to the repetitions discussed above, the formation process can then repeatedly repattern the photoresist material 750 to form a new opening 752*b* (e.g., as illustrated in FIG. 7D) and etch the outer surface 724*a* of the bond pad 724 through the new opening 752*b* to expand the depression 726 (e.g., as illustrated in FIG. 7E). After any suitable number of repetitions (including only a single pass through the patterning and etching process), the formation process can strip the photoresist material 750. As a result, as illustrated in FIG. 7F, the surface 723 of the semiconductor substrate 722 is re-exposed and the depression 726 in the bond pad 724 is complete. The repetitions of the patterning and etching process can be controlled to help match the shape of the resulting depression 726 to the shape of a solder structure (e.g., a solder ball) that the bond pad 724 will interface within a die stack.

In some embodiments, the etching process creates vertical, straight sidewalls to form a stepped depression 726 in the bond pad 724 (e.g., resulting from a perfectly anisotropic etching process). In some embodiments, the etching process creates linearly sloped sidewalls in the depression 726 (e.g., resulting from an imperfectly anisotropic wet etching process). In some embodiments, the etching process creates curvilinear sidewalls in the depression 726 (e.g., resulting from a perfectly isotropic etching process). In some embodiments, the formation process can also include a grinding process (or other processes) to help create a curvilinear shape and/or to help match the shape of the depression to the shape of the solder structure.

Figure 8:
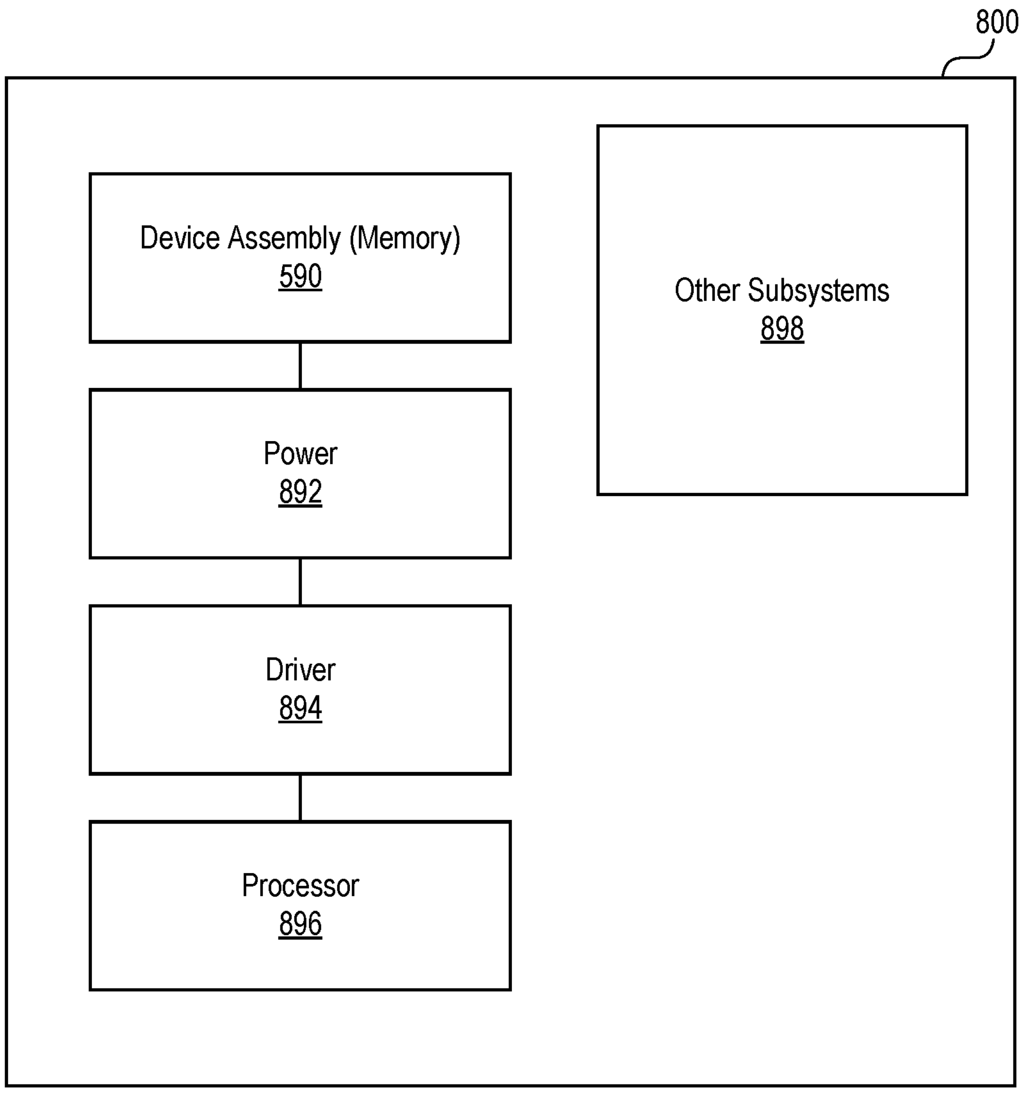
FIG. 8 is a schematic view of a system that includes a semiconductor die assembly configured in accordance with embodiments of the present technology.

FIG. 8 is a schematic view of a system that includes a semiconductor die assembly configured in accordance with embodiments of the present technology. The stacked semiconductor devices discussed above can be incorporated into any of a myriad of larger and/or more complex systems, a representative example of which is system 800 shown schematically in FIG. 8. The system 800 can include a memory 890 (e.g., SRAM, DRAM, flash, and/or other memory devices), a power supply 892, a drive 894, a processor 896, and/or other subsystems or components 898. Stacked semiconductor devices having bond pads with curvilinear concave depressions of the type discussed above with respect to FIGS. 3A-7F can be included in any of the elements shown in FIG. 8. Purely by way of example, the memory 890 can include a stacked semiconductor device with memory dies that are connected through bond pads with curvilinear concave depressions to improve the quality of the memory 890 and/or the system 800 (e.g., by improving the alignment of the memory dies in the stack by reducing the die sliding therein).

The resulting system 800 can be configured to perform any of a wide variety of suitable computing, processing, storage, sensing, imaging, and/or other functions. Accordingly, representative examples of the system 800 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 800 include lights, cameras, vehicles, etc. With regard to these and other examples, the system 800 can be housed in a single unit or distributed over multiple interconnected units, e.g., through a communication network. The components of the system 800 can accordingly include local and/or remote memory storage devices and any of a wide variety of suitable computer-readable media.

From the foregoing, it will be appreciated that specific embodiments of the technology have been described herein for purposes of illustration, but well-known structures and functions have not been shown or described in detail to avoid unnecessarily obscuring the description of the embodiments of the technology. To the extent any material incorporated herein by reference conflicts with the present disclosure, the present disclosure controls. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Furthermore, as used herein, the phrase "and/or" as in "A and/or B" refers to A alone, B alone, and both A and B. Additionally, the terms "comprising," "including," "having," and "with" are used throughout to mean including at least the recited feature(s) such that any greater number of the same features and/or additional types of other features are not precluded. Further, the terms "approximately" and "about" are used herein to mean within at least within 10 percent of a given value or limit. Purely by way of example, an approximate ratio means within ten percent of the given ratio.

From the foregoing, it will also be appreciated that various modifications may be made without deviating from the disclosure or the technology. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments.

Furthermore, although advantages associated with certain embodiments of the technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:

1. A stacked semiconductor device, comprising:

a package substrate;

a first semiconductor die carried by the package substrate, the first semiconductor die having an upper surface and a first bond pad carried by the upper surface, wherein the first bond pad has an uppermost surface with a curvilinear concave depression formed in the uppermost surface;

a second semiconductor die carried by the first semiconductor die, the second semiconductor die having a lower surface and a second bond pad carried by the lower surface; and a solder structure electrically coupling the first bond pad and the second bond pad and at least partially filling the curvilinear concave depression formed in the uppermost surface of the first bond pad.

2. The stacked semiconductor device of claim 1 wherein the curvilinear concave depression formed in the uppermost surface of the first bond pad increases a contact area between the first bond pad and the solder structure relative to a planar contact area of an identical plan-form dimension.

3. The stacked semiconductor device of claim 1 wherein the curvilinear concave depression increases a contact pressure between the first bond pad and the solder structure during a bonding process to reduce die slippage during the bonding process.

4. The stacked semiconductor device of claim 1 wherein the curvilinear concave depression has a depth, wherein the solder structure has a height, and wherein the depth is between 3 percent and 15 percent of the height.

5. The stacked semiconductor device of claim 1 wherein the curvilinear concave depression has a depth between 0.2 micrometers and 1.2 micrometers.

6. The stacked semiconductor device of claim 1 wherein the curvilinear concave depression has a width between 0.2 micrometers and 1.2 micrometers.

7. The stacked semiconductor device of claim 1 wherein:

the package substrate has an active surface and a third bond pad carried by the active surface, wherein the third bond pad has an outer surface with a second curvilinear concave depression formed in the outer surface;

the first semiconductor die has a lowermost surface and a fourth bond pad carried by the lowermost surface; and the stacked semiconductor device further comprises a second solder structure electrically coupling the third bond pad and the fourth bond pad and at least partially filling the second curvilinear concave depression.

8. The stacked semiconductor device of claim 1 wherein the second semiconductor die has a top surface and a third bond pad carried by the top surface, wherein the third bond pad has an outer surface with a second curvilinear concave depression formed in the outer surface, and wherein the stacked semiconductor device further comprises:

a third semiconductor die carried by the second semiconductor die, the second semiconductor die having a bottom surface and a fourth bond pad carried by the bottom surface; and a second solder structure electrically coupling the third bond pad and the fourth bond pad and at least partially filling the second curvilinear concave depression in the third bond pad.

9. The stacked semiconductor device of claim 1 wherein the solder structure completely fills the curvilinear concave depression.

10. A stacked semiconductor device, comprising:

a package substrate;

a stack of semiconductor dies carried by the package substrate, wherein each semiconductor die in the stack of semiconductor dies comprises:

a lower surface having one or more first bond pads; and an upper surface opposite the lower surface and having one or more second bond pads, wherein each of the one or more second bond pads includes a curvilinear concave depression formed in an outer surface of each of the one or more second bond pads; and one or more solder structures each individually electrically coupled between a corresponding pair of the one or more first bond pads and the one or more second bond pads.

11. The stacked semiconductor device of claim 10 wherein each of the curvilinear concave depressions formed in the outer surface of the one or more second bond pads has a depth between 0.2 micrometers and 1.2 micrometers.

12. The stacked semiconductor device of claim 10, further comprising:

a top die having a bonding surface with one or more third bond pads facing the upper surface of an uppermost die in the stack of semiconductor dies; and one or more additional solder structures each individually electrically coupled between corresponding pairs of the one or more second bond pads on the uppermost die and the one or more third bond pads.

13. The stacked semiconductor device of claim 10 wherein each of the curvilinear concave depressions formed the outer surface of the one or more second bond pads increases a contact pressure between each of the one or more solder structures and the one or more second bond pads to maintain alignment of the stack of semiconductor dies during a bonding process.

14. The stacked semiconductor device of claim 10 wherein each of the one or more solder structures completely fills the curvilinear concave depression formed the outer surface of the second bond pad in the corresponding pair.

* * * * *